United States Patent
Exeter

(10) Patent No.: US 7,853,224 B2
(45) Date of Patent: Dec. 14, 2010

(54) FAST SETTLING RADIO RECEIVER AUTOMATIC GAIN CONTROL SYSTEM

(75) Inventor: George R. Exeter, West Lothian (GB)

(73) Assignee: Micrel, Incorporated, San Jose, CA (US)

( * ) Notice: Subject to any disclaimer, the term of this patent is extended or adjusted under 35 U.S.C. 154(b) by 636 days.

(21) Appl. No.: 11/934,669

(22) Filed: Nov. 2, 2007

(65) Prior Publication Data

US 2009/0117868 A1    May 7, 2009

(51) Int. Cl.
   *H04B 17/02*    (2006.01)
   *H04B 7/00*    (2006.01)
(52) U.S. Cl. .................... 455/136; 455/138; 455/232.1
(58) Field of Classification Search ............. 455/127.2, 455/136, 138, 219, 232.1, 234.1, 245.1, 250.1, 455/251.1; 330/129, 254
   See application file for complete search history.

(56) References Cited

U.S. PATENT DOCUMENTS

| | | | |
|---|---|---|---|
| 4,633,518 A * | 12/1986 | Kennedy et al. ......... | 455/242.1 |
| 4,634,997 A * | 1/1987 | Tompsett et al. ............ | 330/284 |
| 5,165,017 A * | 11/1992 | Eddington et al. .......... | 381/321 |
| 5,524,009 A * | 6/1996 | Tuutijarvi et al. ........... | 370/332 |
| 6,038,435 A * | 3/2000 | Zhang ...................... | 455/234.1 |
| 7,265,626 B2 * | 9/2007 | Teo et al. ..................... | 330/279 |
| 7,433,431 B2 * | 10/2008 | Birkett ........................ | 375/345 |

* cited by examiner

*Primary Examiner*—Sonny Trinh
(74) *Attorney, Agent, or Firm*—Bever, Hoffman & Harms, LLP; Patrick T. Bever

(57) ABSTRACT

A fast settling AGC system includes a "fast settle" comparator that facilitates fast settling of strong radio receiver output signals from a maximum to an intermediate voltage level at the start of each transmission burst, and a "normal" AGC comparator that further settles the output signal from the intermediate voltage level to a desired target output voltage level at a slower "normal" rate. The gain control signal components generated by both the "fast settle" comparator and the "normal" AGC comparator are summed and applied to the gain control terminal of a variable gain amplifier. The gain control signal component generated by the "fast settle" comparator has a higher current level than the gain control signal component generated by the "normal" comparator, but is terminated when receiver output signal drops to the intermediate voltage level.

17 Claims, 2 Drawing Sheets

FAST SETTLING RADIO RECEIVER AUTOMATIC GAIN CONTROL SYSTEM

FIELD OF THE INVENTION

This invention relates to radio receiver circuits, and more particularly to radio receiver circuits including automatic gain control.

BACKGROUND OF THE INVENTION

FIG. 3 is a simplified block diagram illustrating a conventional radio receiver 50 including an antennae 51 for received a radio signal RS, a receiver front end circuit 52 for converting radio signal RS into a filtered (electrical) signal $V_{FILT}$, a variable gain amplifier 53 and a demodulator 54 for demodulating filtered signal $V_{FILT}$ to produce an output signal $V_{OUT}$ that is used, for example, to represent digital pulses (note that the present invention is of most benefit with digital pulse signals), or to generate music or other sounds representing information carried by radio signal RS. The specific functions performed by receiver front end circuit 52, amplifier 53, and demodulator 54 are well known in the art, and therefore a more detailed description is omitted for brevity.

It is a common practice in conventional radio receivers to compensate for the wide range of signal strengths of received radio signals RS by utilizing a comparator 55 to compare the voltage level of output signal $V_{OUT}$ with a reference signal $V_{REF}$, and to generate a gain control signal $V_{GC}$ that is applied to a gain control terminal 53A of variable gain amplifier 53 in order to adjust the signal path amplification of amplifier 53 such that output signal $V_{OUT}$ is maintained at a near constant amplitude. Such a closed loop control system (i.e., including amplifier 53, demodulator 54, comparator 55, and filter capacitor 56) is commonly referred to as automatic gain control (AGC), and is referred to below as the AGC loop.

FIG. 4 is a waveform diagram illustrating the effect of a relatively strong radio signal RS (i.e., a radio signal having a level significantly higher than that required to start AGC action. Referring to the left side of FIG. 4, in the absence of radio signal RS, output signal section $V_{OUT0}$ remains at a zero or minimum noise level. Because output signal section $V_{OUT0}$ remains lower than reference signal $V_{REF}$ prior to time T1, comparator 55 (FIG. 3) generates a corresponding high gain control signal $V_{GC}$ that maximizes the gain of variable gain amplifier 53 (note that the absolute gain value depends on control phase of variable gain amplifier 53; e.g., a gain control signal $V_{GC}$ of 0V equals low gain, and a gain control signal $V_{GC}$ of 2V equals high gain). At time T1, relatively strong radio signal RS is received and causes amplifier 53 to generate an output signal $V_{OUT1}$ that is substantially greater than reference signal $V_{REF}$. In such a closed loop AGC system, reference signal $V_{REF}$ is set equal to the nominal peak output signal required, and if the initial transient is too high, this part of the signal is usually clipped and lost (this is indicated by the short horizontal section between time T1 and the downward sloped portion of signal $V_{OUT2}$ in FIG. 4). In order to adjust output signal $V_{OUT1}$ to the desired output level determined by reference signal $V_{REF}$, comparator 55 causes gain control signal $V_{GC}$ to change such that the gain of amplifier 53 is reduced. This gain decrease (i.e., represented by the downward sloped portion of signal $V_{OUT1}$) occurs at a predetermined rate that is determined by the response time of the AGC loop formed by amplifier 53, demodulator 54, comparator 55 and capacitor 56, whereby (as shown in FIG. 4) output signal $V_{OUT1}$ gradually decreases between times T1 and T2 toward reference signal $V_{REF}$.

The response time of the AGC loop is substantially determined by the output current $I_C$ of comparator 55 and the capacitance of filter capacitor 56, which produce gain control voltage $V_{GC}$. That is, upon receiving a change in output voltage $V_{OUT}$, comparator 55 adjusts output current $I_C$ almost instantaneously to the required output level (e.g., at time T1, current $I_C$ is reduced nearly instantaneously from a substantially maximum level to a level required to adjust output voltage $V_{OUT1}$ to equal reference voltage $V_{REF}$). Although comparator 55 changes current $I_C$ almost instantaneously to the required level, gain control voltage $V_{GC}$, which is related to the charge stored on filter capacitor 56 in response to current $I_C$, changes at a rate determined by the level of current $I_C$ and the capacitance of filter capacitor 56. For example, if the current $I_C$ generated by comparator 55 is relatively low and/or the capacitance of filter capacitor 56 is relatively high, then a relatively long time passes before a significant change in current $I_C$ (e.g., in response to the signal change at time T1) results in a corresponding change in gain control signal $V_{GC}$.

In closed loop AGC system such as that used in radio receiver 50, it is necessary that the response time of the AGC loop is significantly longer than the slowest possible modulation rate of radio signal RS in order to avoid distortion of the signal through loss of low frequency signal components (i.e., when the signal appears to be differentiated). This issue applies to AM radio signals where peak to peak signal swing is directly affected by signal strength, and especially to AM pulse signals. Unfortunately, this long response time leads to difficulty with signals having short burst characteristics when a rapid response is required for initial settling. In particular, when radio signal RS is characterized by short bursts, this long response time produces a problem in that a large proportion of the wanted burst signal may be lost (clipped) or distorted. That is the output signal Vout, between T3 and T4, and after T5, is not at a level suitable for good reception when required. The rate of settling to the desired gain is further reduced as a result of periods T2 to T3, and T4 to T5, when the output signal is below $V_{REF}$, which will cause the gain to increase. This increase in gain through AGC action when no signal is present also helps ensure that the output signal at T1 will usually be greater than previous burst signal.

Note that, although it is possible to reduce the AGC loop response time by increasing current $I_C$ and/or reducing the capacitance of filter capacitor 56, the resulting circuit would not operate in a desirable manner. As stated above, an inherent requirement of any AGC system is that the AGC loop response time must be longer than the slowest modulation rate—otherwise, if the gain control action is too fast, the control acts to distort the wanted signal. Hence, if the gain control is made faster in radio receiver 50 in order to settle transients faster, e.g., by reducing the size of filter capacitor 56, then output signal will be distorted continuously.

What is needed is a radio receiver circuit that avoids the signal "clipping" problems of conventional radio receiver circuits that are caused by a too slow response time, while avoiding the signal distortion problems associated with a too fast response time.

SUMMARY OF THE INVENTION

The present invention is directed to an improved radio receiver circuit that overcomes the problems associated with conventional AGC systems by providing a fast settling AGC system in which different control signals are generated in response to different output/reference differentials to make use of the inherent increase in gain of the radio receiver during signal gaps, with subsequent received signal output greater than desired, to allow a much faster settling AGC action to be used at the start of a new transmitted burst signal, without adverse effect on the later modulated information.

In a disclosed embodiment of the invention, an AGC system for a radio receiver includes both a "normal" comparator and one or more (second) "fast settle" comparators that respectively generate first and second gain control signal components that collectively control the gain of a variable gain amplifier of the radio receiver circuit. The "normal" comparator of the AGC system compares the receiver output signal with a (first) "target" reference voltage, and generates a first gain control signal component in a manner similar to that used in conventional AGC systems (e.g., the first gain control component is generated only when the receiver output signal is greater than the "target" reference voltage). The "fast settling" comparator of the AGC system facilitates a faster overall loop response time during periods when the receiver output signal is significantly higher that the "target" reference voltage by generating the second gain control signal component when the output signal is greater than a selected "intermediate" reference voltage. In effect, the "fast settle" comparator only operates when the received radio signal burst is sufficiently greater than the immediately preceding signal (i.e., the sudden signal strength change is strong enough to generate an output signal that is above the second "intermediate" reference voltage), and serves to adjust the gain of the variable gain amplifier to quickly reduce the output signal from an initial (high) level to an intermediate level that is between the initial level and the desired output level. When the received radio signal is very weak (or after the "fast settle" comparator has adjusted the output signal to the intermediate level), the "normal" comparator operates alone to adjust the gain of the variable gain amplifier at a slower rate, thereby avoiding distortion.

In the disclosed embodiment, two (i.e., "normal" and "fast settle") comparators are operably connected to a filter capacitor such that the current levels of the first and second gain control signal components are collected on the filter capacitor to produce a desired gain control voltage on the gain control terminal of the variable gain amplifier. In one embodiment, the current level of the second gain control signal components is substantially (i.e., greater than two times) higher than a current level of the first gain control signal component whereby the change in the gain control voltage is relatively rapid. In other embodiments, the current level of the second gain control signal components may be substantially equal to the current level of the first gain control signal components, but this would only double the response time of the AGC loop during high output voltage periods, which may not be adequate in some applications. In a specific embodiment, the "normal" and "fast settle" comparators are fabricated such that the first and second gain control signal components and generated in the form of low and high pulse currents, respectively, that are then combined on a filter capacitor to generate the collective gain control signal that defines the response time of the gain control loop. In an alternative embodiment of the invention, the "fast settle" comparator employs hysteresis to reduce switching-on noise. In another alternative embodiment, filtering may be implemented in an alternative manner, for example by using identical comparators with different resistors between the outputs and the filter capacitor on which the control is summed. However, in operation these alternative approaches are less advantageous than the disclosed embodiment.

In accordance with another embodiment of the present invention, an AGC method for a radio receiver circuit includes, when a strong radio signal is first received and a relatively high output signal is generated by the variable gain amplifier of the radio receiver circuit, decreasing the gain of the variable gain amplifier at a first, relatively fast rate until output signal's voltage level is equal to an intermediate reference signal voltage level (which is greater than the target voltage level). Then, when the output signal voltage level has dropped to level between the intermediate reference signal and target voltage level, further decreasing the gain of the variable gain amplifier at a second, relatively slow rate until the output signal voltage level equals the target voltage level. That is, during a first phase of the AGC process, the output voltage is settled at a relative fast rate until the output signal reaches the intermediate reference signal, then the output voltage continues to settle during the second phase at the slower time rate until the output voltage equals the target reference signal. Thus, the present invention changes the AGC gain control signal much more rapidly than conventional systems using only a single rate without adversely affecting the modulated information after the settling phase because the fast settling comparator is not activated once the signal peaks have settled below the higher "intermediate" reference level, as the faster control rate is only used during the initial settling at the start of a signal burst, where the larger signal received has yet to reduce below the higher intermediate reference signal voltage level. Therefore, the present invention significantly reduces the delay within a radio receiver before a good output signal is available on the reception of a signal burst. The present invention is particularly advantageous when operating with transmissions having one or more short bursts of modulated radio frequency carrier with intervening carrier free periods in that the faster initial settling rate improves the receiver's ability to receive shorter burst signals, and reduces the number of sacrificial preamble data bits needed at the start of a burst. The conflicting requirements between AGC response time and lowest undistorted modulation rate are also easier to resolve because the requirements are unchanged during normal operation as per prior art, and ignored during fast settle phase. That is, distortion during the fast settling period may be high, but this portion of the signal is lost in the conventional AGC system due to "clipping" anyway, and by reducing the length of time required to bring the output close to the desired "target", the present invention provides an overall benefit of recovering a low distortion signal more quickly.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in radio receiver circuits. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
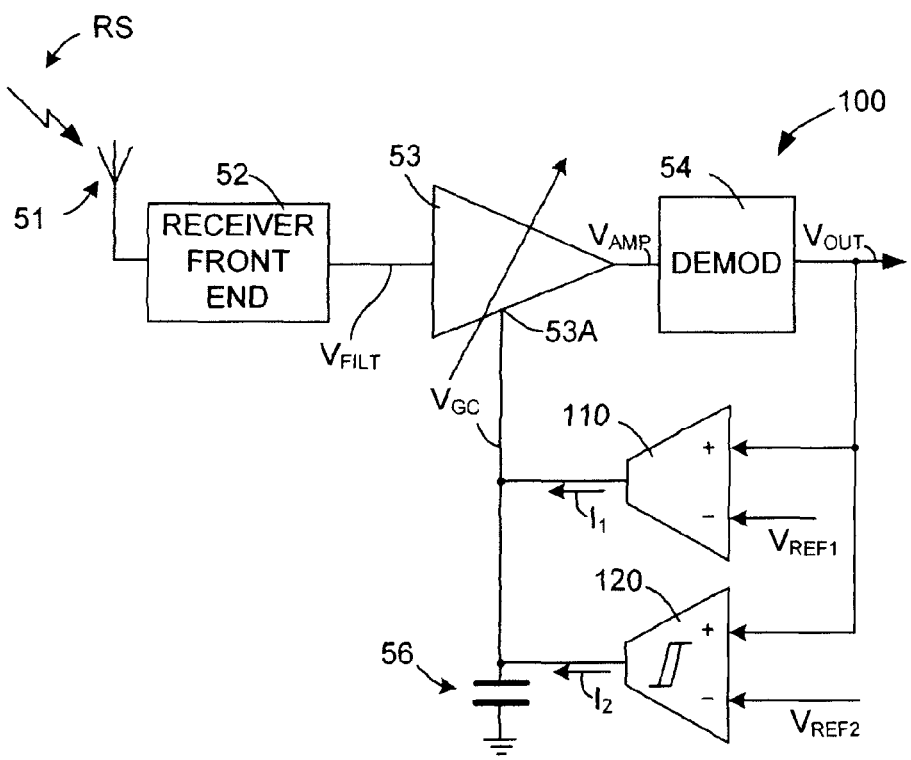
FIG. 1 is a simplified block diagram showing a radio receiver circuit according to an embodiment of the present invention.

FIG. 1 is a block diagram illustrating a radio receiver 100 according to a simplified embodiment of the present invention. Radio receiver 100 generally includes antennae 51, receiver front end circuit 52, gain controlled amplifier 53, and demodulator 54 that are substantially identical to those described above with reference to conventional radio receiver 50, and therefore detailed discussion of these components is omitted below for brevity. In accordance with the present invention, radio receiver 100 also includes a "fast settling" AGC system including a (first) "normal" comparator 110 and a (second) "fast settle" comparator 120 having output terminals coupled to gain control terminal 53A of amplifier 52. Filter capacitor 56, which is also substantially identical to that used in conventional radio receiver 50, is also connected to gain control terminal 53A.

Figure 3:
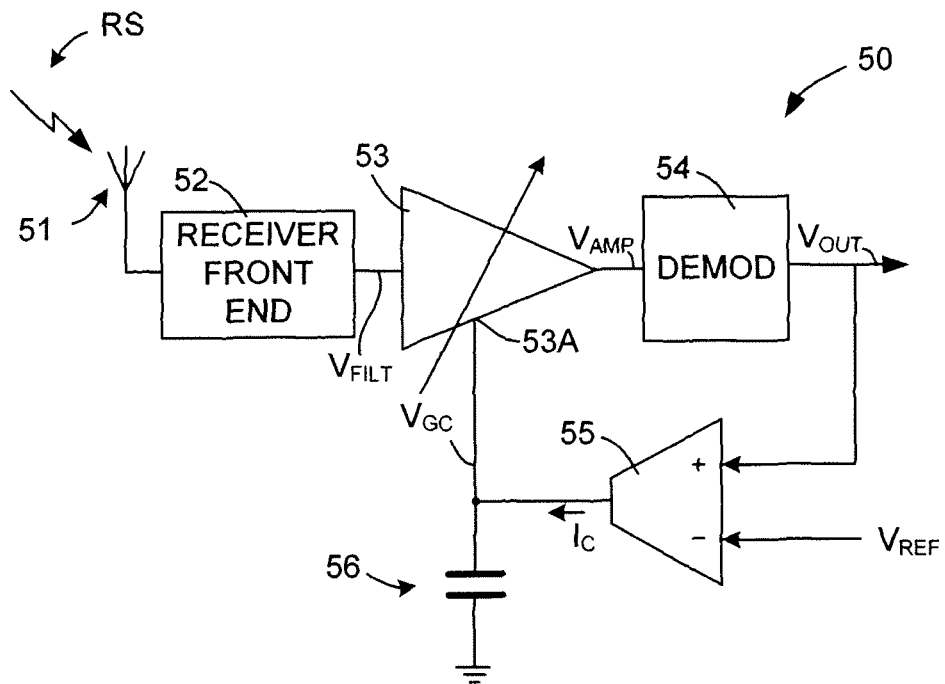
FIG. 3 is a simplified block diagram showing a conventional radio receiver circuit.

"Normal" comparator 110 functions in a manner similar to conventional comparator 55, which is described above with reference to FIG. 3. In particular, "normal" comparator 110 compares output signal $V_{OUT}$ with a first reference voltage $V_{REF1}$, and generates a first gain signal component $I_1$ having a first current level in response to a difference between output signal $V_{OUT}$ and reference voltage $V_{REF1}$.

Similar to "normal comparator 110, "fast settle" comparator 120 also compares output signal $V_{OUT}$ with a second reference voltage $V_{REF2}$, and generates a second gain signal component $I_2$ having a second current level in response to a difference between output signal $V_{OUT}$ and reference voltage $V_{REF2}$. However, in accordance with the present invention, comparator 120 differs from "normal" comparator in ways that are listed in part in the following paragraphs.

First, "fast settle" comparator 120 is operated at a higher threshold than "normal" comparator 110. In one embodiment, this higher threshold is achieved by supplying second reference voltage $V_{REF2}$ with a higher voltage level than first reference voltage $V_{REF1}$. In particular, second reference voltage $V_{REF2}$ represents an intermediate voltage level between the "target" voltage level represented by first reference voltage $V_{REF1}$, and the highest output signal voltage level that can be generated by variable gain amplifier 53. For example, second reference voltage $V_{REF2}$ is in the range of 10 to 40% greater than first reference voltage $V_{REF1}$, and is more preferably in the range of 10 to 30%. In one specific embodiment, and second reference voltage $V_{REF2}$ is supplied at 1.2V, and first reference voltage $V_{REF1}$ is supplied at 1.0V.

Second, "fast settle" comparator 120 differs from "normal" comparator 110 in that "fast settle" comparator 120 is fabricated such that the current level of second gain signal component $I_2$ is higher than the current level of first gain signal component $I_1$, whereby gain signal component $V_{GC}$ drops from an initial maximum voltage level to second reference voltage $V_{REF2}$ at a much faster rate (i.e., in a shorter amount of time) than from second reference voltage $V_{REF2}$ to "target" reference voltage $V_{REF1}$. In one specific embodiment, "fast settle" comparator 120 generates second gain signal component $I_2$ with a current level of 100 µAmps, and "normal" comparator 110 generates first gain signal component $I_1$ with a current level of 10 µAmps. The shorter response time of the AGC loop via "fast settle" comparator 120 facilitates quick settling of the output signal by reducing the time until the desired signal level is available.

In an optional embodiment, "fast settle" comparator 120 is configured using known techniques such that gain control signal component $I_2$ exhibits hysteresis to reduce switching-on noise ("normal" comparator 110 is not fabricated to include hysteresis).

Figure 2:
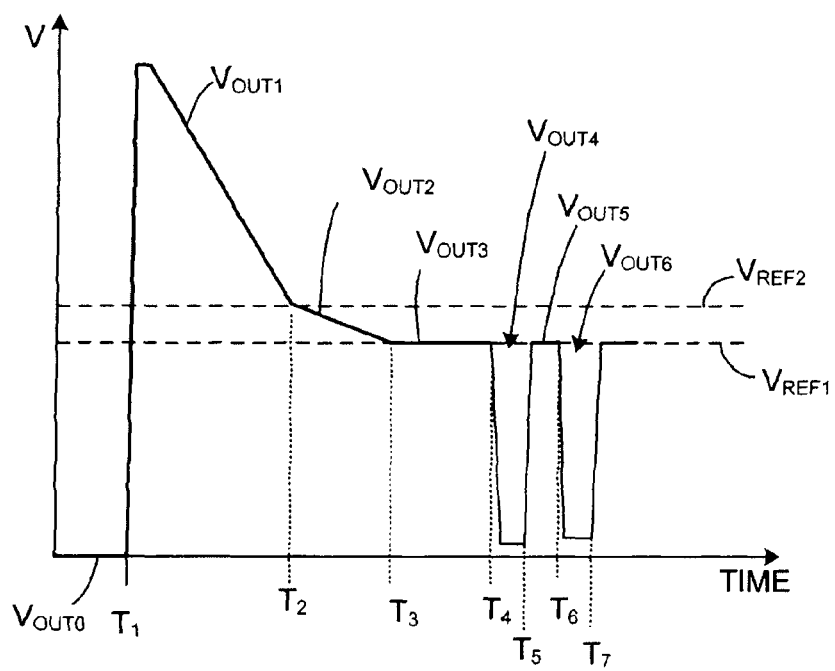
FIG. 2 is a waveform diagram showing the operation of the radio receiver circuit of FIG. 1.

FIG. 2 is a waveform diagram illustrating the fast settling AGC method as applied to radio receiver 100 according to another embodiment of the present invention. Referring to the left side of FIG. 2, in the absence of radio signal RS, output signal section $V_{OUT0}$ remains at a zero or minimum level. (A low level is shown for simplicity as this will commonly be the case with repeating bursts. With sufficient gain and no signal applied for an adequate time, noise will be amplified until the output signal exceeds reference signal $V_{REF1}$ prior to time T1.) Because output signal section $V_{OUT0}$ is lower than reference signals $V_{REF1}$ and $V_{REF2}$, both "normal" comparator 110 and "fast settle" comparator 120 generate gain control signal components $I_1$ and $I_2$ such that gain control signal $V_{GC}$ causes amplifier 53 to generate a maximum gain. At time T1, when a relatively strong radio signal RS is received, a maximum (high) output signal $V_{OUT1}$ that is greater than reference signals $V_{REF1}$ and $V_{REF2}$ is produced due to the maximum gain of amplifier 53, and as a result both the first gain control component signal $I_1$ and the second gain control component signal $I_2$ are generated by "normal" comparator 110 and "fast settle" comparator 120, respectively, which collectively serve to change (e.g., increase) the charge on capacitor 56, which in turn changes gain control signal $V_{GC}$. As indicated in FIG. 2, the shorter response time and higher current level of second gain control component signal $I_2$ causes the gain control signal $V_{GC}$ applied to amplifier 53 to decrease such that output signal $V_{OUT1}$ decreases at a relatively fast rate until time T2. At time T2, when output signal $V_{OUT1}$ is equal to intermediate reference signal $V_{REF2}$, "fast settle" comparator 120 is turned off, terminating the contribution to the amplifier gain provided by second gain control component $I_2$. Thus, between time T2 and T3, when output signal $V_{OUT2}$ has a voltage level between intermediate reference signal $V_{REF2}$ and target reference signal $V_{REF1}$, amplifier 53 the gain control signal $V_{GC}$ applied to amplifier 53 is controlled solely by first gain control component $I_1$. Because gain control signal $V_{GC}$ is changed solely by the lower current level of first gain control component $I_1$, the gain of amplifier 53 decreases at a slower "normal" rate, which in turn causes output signal $V_{OUT2}$ to decrease at a slower "normal" rate. At time T3, when output signal $V_{OUT2}$ has a voltage level equal to target reference signal $V_{REF1}$ (i.e., output signal $V_{OUT3}$ is stabilized (maintained) at target reference voltage $V_{REF1}$), "normal" comparator 110 cycles about target reference signal $V_{REF1}$ after T3 to increase or reduce the gain as necessary to maintain the desired signal level.

Figure 4:
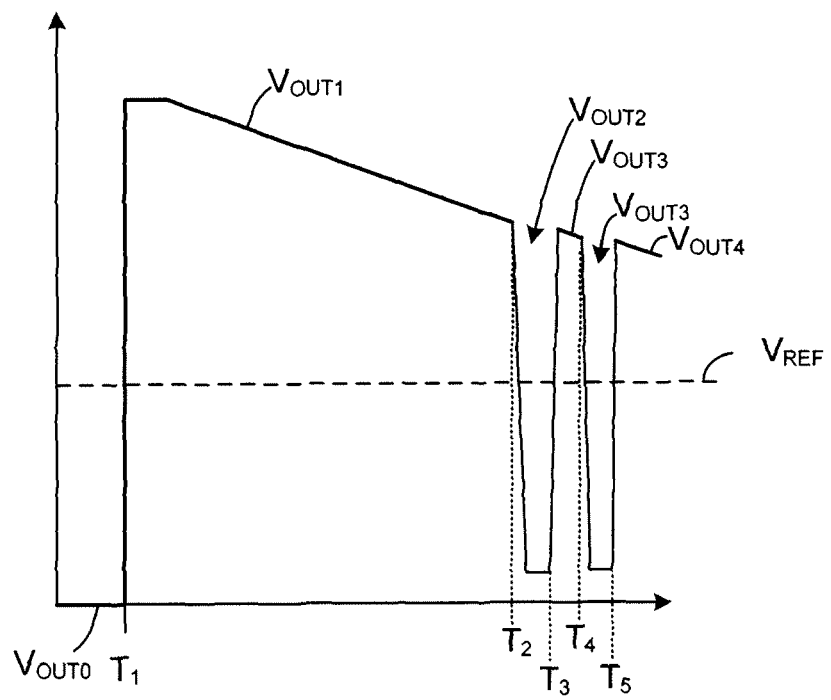
FIG. 4 is a waveform diagram showing the operation of the radio receiver circuit of FIG. 3.

The various signal levels associated with times T4 to T7 in FIG. 2 are provided to illustrate the effectiveness of radio receiver 100 in dealing with received pulse signals. It should be understood that these pulses could be continuous from time T1, or could start at any time after T1 and may have any phase relation with respect to times T2 and T3 in FIG. 2. The improvement provided by the present invention is that, when compared with the pulse signals depicted in FIG. 4 that have improper amplitudes and are distorted, those of FIG. 2 are not distorted and have proper amplitudes after T3.

As set forth in the above example, "fast settle" comparator 120 only operates when radio signal RS is relatively strong (i.e., such that initial voltage level of output signal $V_{OUT1}$ is higher than intermediate reference signal $V_{REF2}$), and its relatively fast control loop response time serves to quickly adjust the gain of variable gain amplifier 53 such that output signal $V_{OUT1}$ changes from the initial level to intermediate level $V_{REF2}$. When the received radio signal is relatively weak (or after "fast settle" comparator 120 has adjusted the output signal to the intermediate level), "fast settle" comparator 120 is turned off (i.e., second gain control component $I_2$ is deasserted and does not affect gain control signal $V_{GC}$), and "normal" comparator operates to adjust the gain of variable gain amplifier 53 at a slower rate by way of first gain control component signal $I_1$, thereby avoiding overshoot. That is, a "normal" rate settling operation similar to that performed in the prior art is obtained after "fast settle" comparator 120 has completed the fast settling action and comparator 120 is no longer active. Hence, operation of radio receiver 100 returns to an operation similar to that used by conventional radio receiver 50 (FIG. 3) after the initial fast settling phase. Further, if fast comparator 120 were kept enabled until the lower threshold, overshoot would be likely to occur.) Further, the present invention is particularly advantageous when operating with transmissions having one or more short bursts of modulated radio frequency carrier with intervening carrier free periods in that "fast settle" comparator 120 improves the ability of radio receiver 100 to receive shorter burst signals by reducing the time required to settle the signal to the desired operating level.

In accordance with an optional embodiment of the present invention, both "normal" comparator 110 and "fast settle" comparator 120 are fabricated such that first gain control signal component $I_1$ and second gain control signal component $I_2$ are generated in a form that includes pulse currents that are then combined on filter capacitor $C_1$ to generate the collective gain control signal $V_{GC}$.

Although the present invention has been described with respect to certain specific embodiments, it will be clear to those skilled in the art that the inventive features of the present invention are applicable to other embodiments as well, all of which are intended to fall within the scope of the present invention. For example, those skilled in the art will recognize that the function performed by the disclosed AGC circuit may be achieved, for example, by configuring the comparator internal circuits with deliberate inbuilt offsets (i.e., generating a voltage equivalent to a difference between the reference signals, e.g., $V_{REF1}$-$V_{REF2}$, within the comparator input circuit). In another alternative embodiment it would be possible to disable one gain control comparator with the output from the other comparator, so that only one of the two comparators is enabled to generate a relatively high current gain signal component during the "fast settle" phase, and only the other comparator is enabled to generate a relatively low current gain control signal during the "normal settle" phase. It is also possible to make a comparator with hysteresis equal to $V_{REF1}$-$V_{REF2}$ such that the comparator turns on at $V_{REF1}$ and turns off at $V_{REF2}$). In another alternative embodiment, low pass filter and control signal summing arrangements using resistors instead of currents are employed. Accordingly, the present invention is not intended to necessarily be limited by the specific embodiments described below unless specified in the appended claims.

The invention claimed is:

1. An automatic gain control (AGC) system in a radio receiver circuit for controlling the gain of a variable gain amplifier such that a voltage level of an output signal generated by the radio receiver circuit is adjusted to a predetermined target voltage level, wherein the AGC system comprises:

means for decreasing a gain of the variable gain amplifier at a first, relatively fast rate when the voltage level of the output signal is greater than an intermediate voltage level, the intermediate voltage level being greater than the target voltage level, and means for decreasing the gain of the variable gain amplifier at a second, relatively slow rate when the voltage level of the output signal is between the intermediate voltage level and the target voltage level, wherein said means for decreasing the gain of the variable gain amplifier at the first, relatively fast rate comprises means for generating both a first gain control signal component and a second gain control signal component when the voltage level of the output signal is greater than the intermediate voltage level, and wherein said means for decreasing the gain of the variable gain amplifier at the second, relatively slow rate comprises means for generating only the first gain control signal component when the voltage level of the output signal is between the intermediate voltage level and the target voltage level.

2. An automatic gain control (AGC) system in a radio receiver circuit for controlling the gain of a variable gain amplifier such that a voltage level of an output signal generated by the radio receiver circuit is adjusted to a predetermined target voltage level, wherein the AGC system comprises:

means for decreasing a gain of the variable gain amplifier at a first, relatively fast rate when the voltage level of the output signal is greater than an intermediate voltage level, the intermediate voltage level being greater than the target voltage level, and means for decreasing the gain of the variable gain amplifier at a second, relatively slow rate when the voltage level of the output signal is between the intermediate voltage level and the target voltage level, wherein said means for decreasing the gain of the variable gain amplifier at the first, relatively fast rate comprises means for generating a high gain control signal component when the voltage level of the output signal is greater than the intermediate voltage level, wherein said means for decreasing the gain of the variable gain amplifier at the second, relatively slow rate comprises means for generating a low gain control signal component when the voltage level of the output signal is between the intermediate voltage level and the target voltage level, and wherein the high gain control signal component has a greater current level than the low gain control signal component.

3. An automatic gain control (AGC) system in a radio receiver circuit for controlling the gain of a variable gain amplifier such that an output signal generated by the radio receiver circuit is maintained at a near constant amplitude, wherein the AGC system comprises:

means for generating a first gain control signal component when a voltage level of the output signal is greater than a first threshold voltage, for generating a second gain control signal component only when a voltage level of the output signal is greater than a second threshold voltage, and for controlling the gain of the variable gain amplifier in response to both the first gain control signal component and the second gain control signal component, wherein the second threshold voltage is greater than the first reference voltage such that both the first gain control signal component and the second gain control signal component are generated when the voltage level of the output signal is greater than the second threshold voltage, and such that only the first gain control signal component is generated when the voltage level of the output signal is between the second threshold voltage and the first threshold voltage.

4. The AGC system of claim 3, wherein said means comprises:
   a first comparator for comparing the output signal with a first reference voltage, and for generating the first gain control signal component in response to a difference between the output signal and the first reference voltage; and
   a second comparator for comparing the output signal with a second reference voltage, and for generating the second gain control signal component in response to a difference between the output signal and the second reference voltage, and
   wherein the second reference voltage is greater than the first reference voltage.

5. The AGC system of claim 4, wherein said means further comprises a capacitor having a terminal connected to each of an output terminal of the first comparator, an output terminal of the second comparator, and a gain control terminal of the variable gain amplifier, whereby said capacitor supplies a gain control voltage to said gain control terminal of the variable gain amplifier in response to a sum of said first gain control signal component and said second gain control signal component.

6. The AGC system of claim 5, wherein the second gain control signal component has a current level that is greater than a current level of the first gain control signal component.

7. The AGC system of claim 6, wherein the current level of the second gain control signal component is at least two times greater than the current level of the first gain control signal component.

8. The AGC system of claim 4, wherein the second comparator includes means for producing the second gain control signal component with hysteresis such that switching noise is minimized in the gain control voltage when the voltage level of the output signal is equal to the second reference voltage.

9. The AGC system of claim 4, wherein both the first comparator and the second comparator include means for generating said first and second gain control signal components in the form of pulse currents.

10. A radio receiver circuit for generating an output signal in response to a received radio signal comprising:
    a receiver front end circuit for converting the radio signal into an un-amplified signal;
    a variable gain amplifier for amplifying the un-amplified signal in accordance with a gain control signal received on a gain control terminal;
    a demodulator for demodulating the amplified signal generated by the variable gain amplifier to produce the output signal; and
    an automatic gain control (AGC) system including:
        a first comparator for comparing the output signal with a first reference voltage, and for generating a first gain signal component having a first current level in response to a difference between the output signal and the first reference voltage;
        a second comparator for comparing the output signal with a second reference voltage, and for generating a second gain signal component having a second current level in response to a difference between the output signal and the second reference voltage; and
        means for generating the gain control signal received on the gain control terminal of the variable gain amplifier by summing the first gain signal component and the second reference voltage,
    wherein the second reference voltage is greater than the first reference voltage.

11. The radio receiver circuit of claim 10, wherein the second current level of the second gain signal component is greater than the first current level of the first gain signal component.

12. The radio receiver circuit of claim 11, wherein the second current level of the second gain control signal component is at least two times greater than the first current level of the first gain control signal component.

13. The radio receiver circuit of claim 10, wherein the second comparator includes means for producing the second gain control signal component with hysteresis such that switching noise is minimized in the gain control signal when the voltage level of the output signal is equal to the second reference voltage.

14. The radio receiver circuit of claim 10, wherein both the first comparator and the second comparator include means for generating said first and second gain control signal components in the form of pulse currents.

15. The radio receiver circuit of claim 10, wherein said means comprises a capacitor having a terminal connected to each of an output terminal of the first comparator, an output terminal of the second comparator, and the gain control terminal of the variable gain amplifier.

16. A method for providing automatic gain control (AGC) in a radio receiver circuit including a variable gain amplifier such that a voltage level of an output signal generated by the radio receiver circuit is adjusted to a predetermined target voltage level, wherein the method comprises:
    decreasing a gain of the variable gain amplifier at a first, relatively fast rate when the voltage level of the output signal is greater than an intermediate voltage level that is greater than the target voltage level, and
    decreasing the gain of the variable gain amplifier at a second, relatively slow rate when the voltage level of the output signal is between the intermediate voltage level and the target voltage level,
    wherein decreasing the gain of the variable gain amplifier at the first, relatively fast rate comprises generating both a first gain control signal component and a second gain control signal component when the voltage level of the output signal is greater than the intermediate voltage level, and
    wherein decreasing the gain of the variable gain amplifier at the second, relatively slow rate comprises generating only the first gain control signal component when the voltage level of the output signal is between the intermediate voltage level and the target voltage level.

17. The method of claim 16,
    wherein generating both the first gain control signal component and the second gain control signal component comprises causing a first comparator and a second comparator to generate said first gain control signal component and the second gain control signal component, respectively, and
    wherein generating only the first gain control signal component comprises turning off the second comparator.

* * * * *